(12) United States Patent
Chen

(10) Patent No.: US 8,498,115 B2
(45) Date of Patent: Jul. 30, 2013

(54) ADJUSTABLE VENTILATION SYSTEM

(75) Inventor: Chin-Hui Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 106 days.

(21) Appl. No.: 13/205,622

(22) Filed: Aug. 9, 2011

(65) Prior Publication Data

US 2012/0188713 A1  Jul. 26, 2012

(30) Foreign Application Priority Data

Jan. 26, 2011  (TW) .............................. 100102971 A

(51) Int. Cl.
*H05K 7/20* (2006.01)
*H05K 7/00* (2006.01)

(52) U.S. Cl.
USPC .......................................... 361/695; 454/184

(58) Field of Classification Search
USPC ................................................. 361/694–695
See application file for complete search history.

(56) References Cited

U.S. PATENT DOCUMENTS

| | | | | |
|---|---|---|---|---|
| 6,342,004 B1 * | 1/2002 | Lattimore et al. | ............ | 454/184 |
| 6,554,697 B1 * | 4/2003 | Koplin | ............ | 454/184 |
| 6,735,079 B2 * | 5/2004 | Huang | ............ | 361/695 |
| 6,776,707 B2 * | 8/2004 | Koplin | ............ | 454/184 |
| 7,508,663 B2 * | 3/2009 | Coglitore | ............ | 361/695 |
| 7,663,881 B2 * | 2/2010 | Kuo | ............ | 361/692 |
| 7,826,213 B2 * | 11/2010 | Peng et al. | ............ | 361/679.46 |
| 2004/0057209 A1 * | 3/2004 | Huang | ............ | 361/690 |
| 2008/0112129 A1 * | 5/2008 | Kuo | ............ | 361/687 |

* cited by examiner

*Primary Examiner* — Gregory Thompson
(74) *Attorney, Agent, or Firm* — Altis Law Group, Inc.

(57) ABSTRACT

An electronic device includes a case having a vent defining a plurality of holes. The electronic device further includes an adjusting plate movably mounted on the case and aligning with the vent, and the adjusting plate defines a plurality of holes. A plurality of vent regions are defined on the vent, at least one hollow region and at least one tangible region are defined on the adjusting plate. The adjusting plate is movable relative to the vent such that the plurality of the holes of the adjusting plate aligns with, or the adjusting plate partially blocks or totally blocks, the plurality of holes of the vent.

9 Claims, 4 Drawing Sheets

ADJUSTABLE VENTILATION SYSTEM

BACKGROUND

1. Technical Field

The present disclosure relates to a ventilation system, and particularly, to an adjustable ventilation system.

2. Description of Related Art

Electronic devices often have ventilation systems with fans for heat dissipation, and the fans of the ventilation system blow hot air out of the electronic device. However, when some of the fans are not in use or breakdown, the hot air may flow back to the electronic device through the disabled fans, and thus reducing the cooling efficiency of the ventilation systems.

Therefore, what is needed is an adjustable ventilation system that overcomes the problem.

BRIEF DESCRIPTION OF THE DRAWINGS

The components in the drawings are not necessarily drawn to scale, the emphasis instead being placed upon clearly illustrating the principles of the adjustable ventilation system. Moreover, in the drawings, like reference numerals designate corresponding parts throughout the several views.

DETAILED DESCRIPTION

Figure 1:
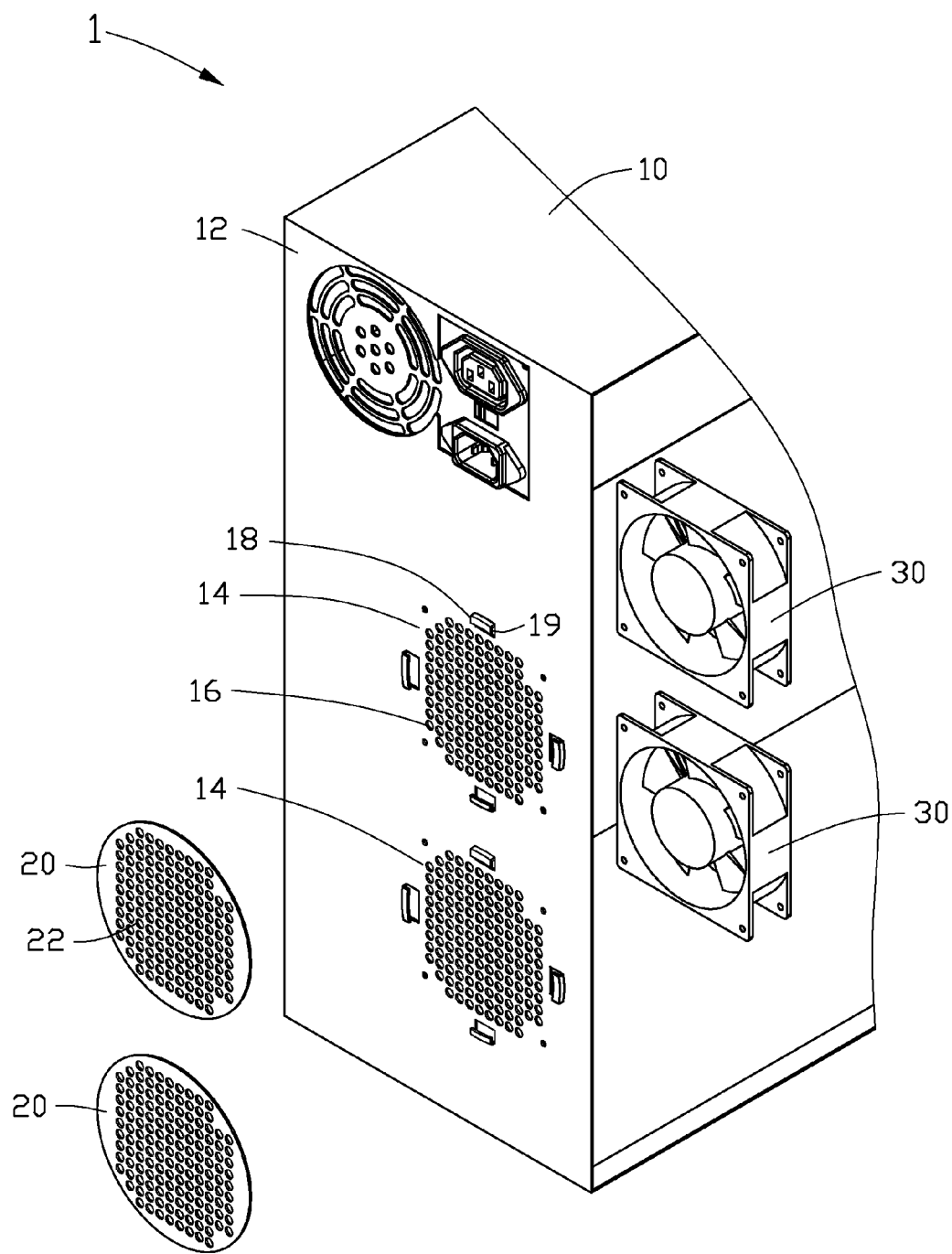
FIG. 1 is an isometric, exploded view of a partially-illustrated electronic device having an adjustable ventilation system, in accordance with an exemplary embodiment.

Referring to FIG. 1, the electronic device 1 includes a case 10, two adjusting plates 20, and two fans 30 installed in the case 10.

The case 10 includes a back panel 12 having two vents 14, corresponding to the two adjusting plates 20, with a number of vent holes 16 arranged in a matrix. In addition, fixing elements 18 protrudes from the back panel 12 around the vents 14, forming chutes 19 between the back plate 12 and the fixing element 18 to allow the adjusting plate 20 to stay close to the vent 14. Each adjusting plate 20 is a circular plate having a number of adjusting holes 22 arranged in a matrix identical to the matrix formed by the vent holes 16 of the vent 14.

Figure 2:
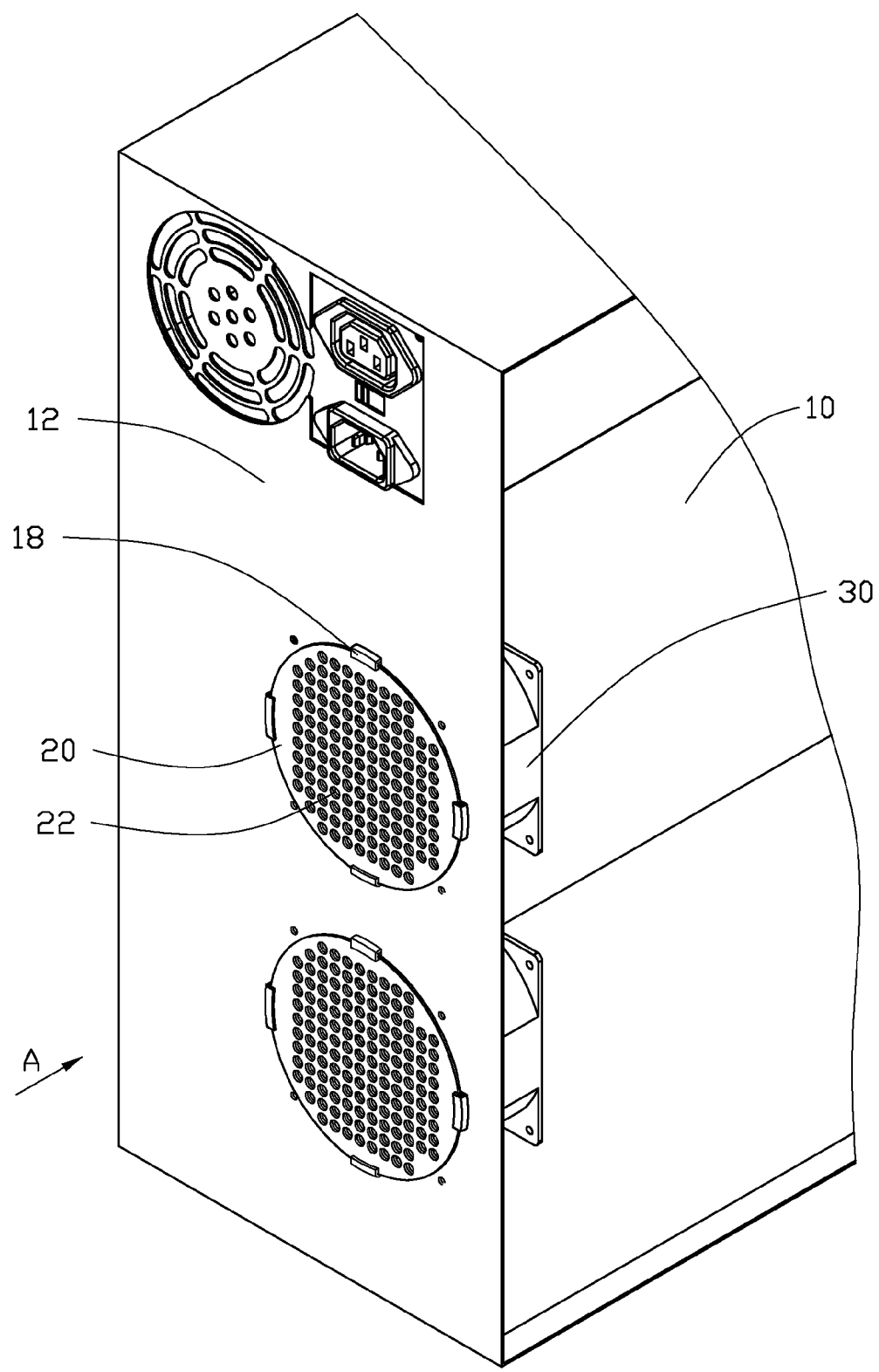
FIG. 2 is an isomeric view of the partial electronic device of FIG. 1.

Referring to FIG. 1-2, each adjusting plate 20 is assembled between the back panel 12 and the fixing elements 18. The adjusting plate 20 can rotate freely in the chutes 19, and relative to the vents 14. The fans 30 are mounted in an inner side of the back panel 12, and aligned with the vents 14, respectively.

Figure 3:
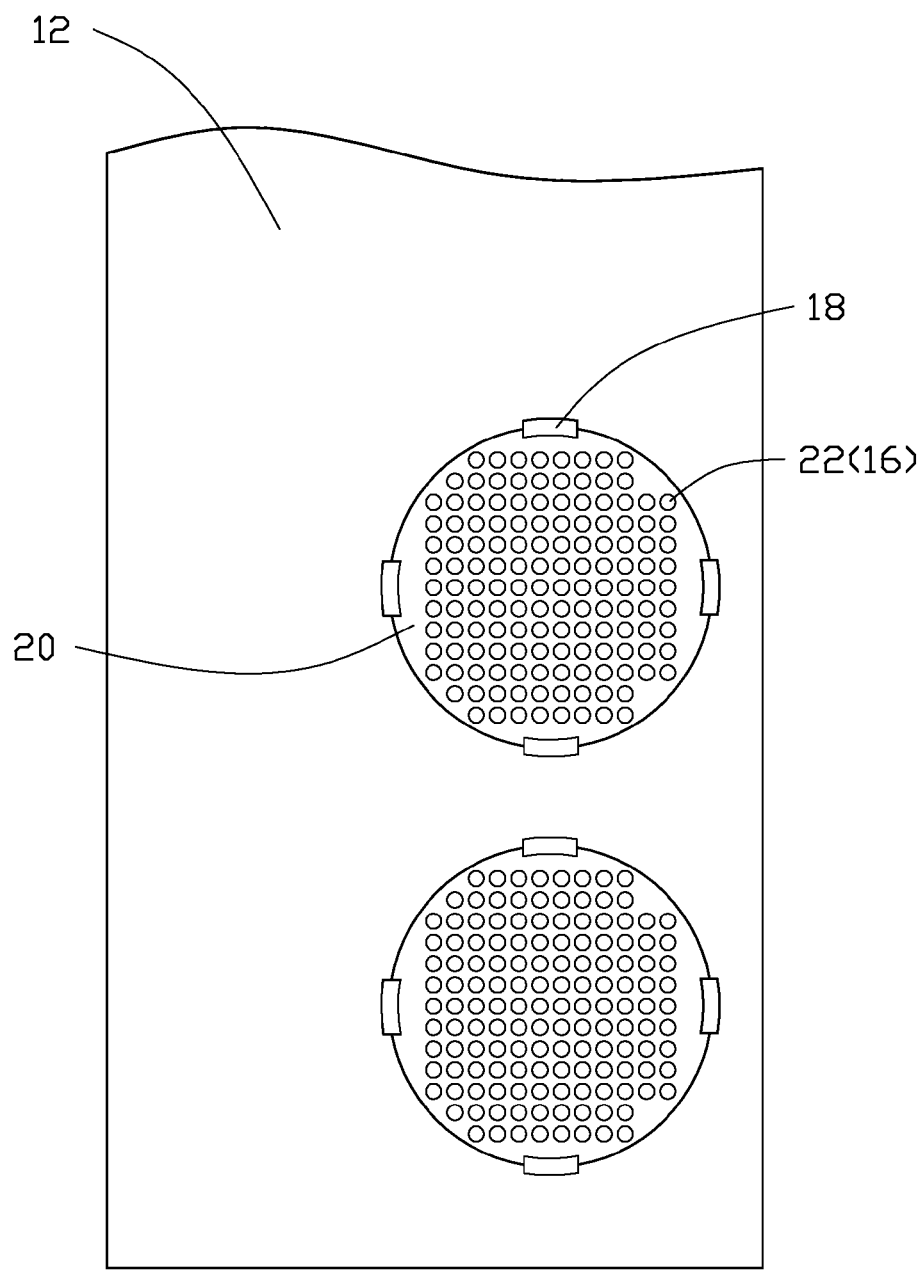
FIG. 3 is a side view of the electronic device of FIG. 1, showing an adjusting plates in an open position.

Referring to FIG. 3, the adjusting holes 22 of the adjusting plate 20 align with the vent holes 16 of the vent 14 to allow hot air to flow from an inside of the case 10 to an outside of the case 10.

Figure 4:
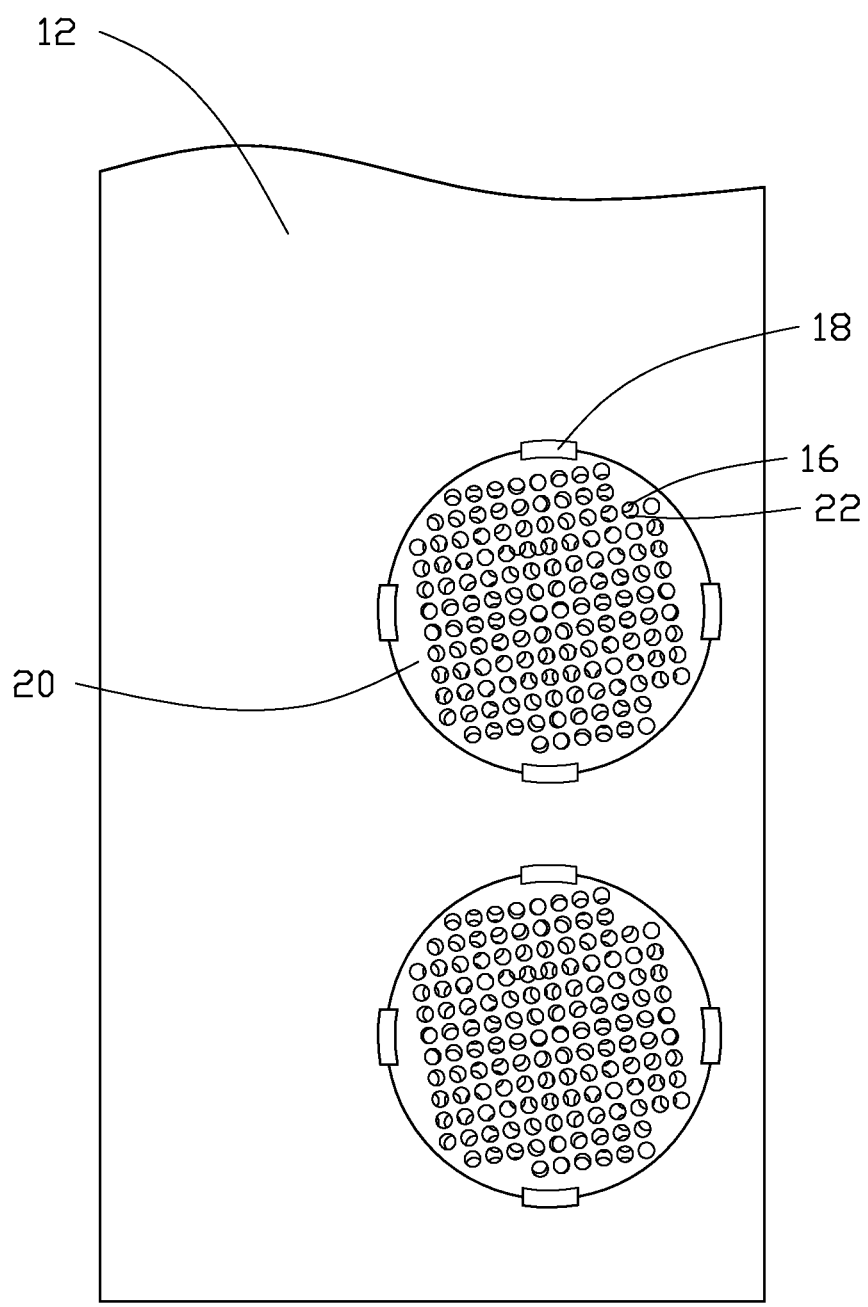
FIG. 4 is another side view of the electronic device of FIG. 1 showing an adjusting plates in a closed position.

Referring to FIG. 4, volume of the hot air flowed from the inside of the case 10 can be adjusted by rotating the adjusting plate 20 to partially block the vent holes 16 of the vent 14. The adjusting plate 20 can be rotated to completely block the vent holes 16 of the vent 14.

In other embodiments, more adjusting plates 20 and vents 14 can be arranged on the case 10 when more fans 30 are installed.

In other embodiments, a center of the adjusting plate 20 can be pivotally mounted on to a center of the vent 14 to allow the adjusting plate 20 to rotate close to the vent 14.

Therefore, the air volume each fan 30 of the electronic device 1 displaces can be controlled separately by adjusting the adjusting plate 20. The vent 14 can be completely open when the fan is in operation, and closed when the fan is disabled.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. An electronic device, comprising:
    a case comprising a vent, the vent defining a plurality of holes; and
    an adjusting plate movably mounted on the case and aligning with the vent, the adjusting plate defining a plurality of holes,
    wherein the adjusting plate is movable relative to the vent such that at a position the plurality of holes of the adjusting plate does not aligns with the plurality of holes of the vent and the adjusting plate totally blocks the plurality of holes of the vent.

2. The electronic device as claimed in claim 1, wherein the case comprises at least a fixing element to retain the adjusting plate on to the case when the adjusting plate is moving relative to the vent.

3. The electronic device as claimed in claim 2, wherein the fixing element protrudes from the case to fix a rim of the adjusting plate when the adjusting plate is moving relative to the vent.

4. The electronic device as claimed in claim 3, wherein the fixing element forms a chute between the fixing element and the case to receive the adjusting plate when the adjusting plate is moving relative to the vent.

5. The electronic device as claimed in claim 1, wherein the adjusting plate is round-shaped.

6. The electronic device as claimed in claim 1, wherein the plurality of holes of the vent and the plurality of holes of the adjusting plate are arranged in a matrix.

7. The electronic device as claimed in claim 1, wherein a fan is installed on the case in corresponding to the vent.

8. The electronic device as claimed in claim 7, wherein the adjusting plate totally blocks the plurality of holes of the vent when the fan is disabled.

9. The electronic device as claimed in claim 1, wherein volume of air flow though each of the plurality of holes of the vent is adjusted when the adjusting plate is moved relative to the vent.

* * * * *